United States Patent
Cao et al.

(10) Patent No.: US 9,858,644 B2
(45) Date of Patent: Jan. 2, 2018

(54) BAYER COLOR FILTER ARRAY BASED HIGH DYNAMIC RANGE VIDEO RECORDING METHOD AND DEVICE

(71) Applicant: SZ DJI TECHNOLOGY CO., LTD., Shenzhen (CN)

(72) Inventors: Zisheng Cao, Shenzhen (CN); Lifu Yu, Shenzhen (CN); Wenhui Zhong, Shenzhen (CN); Mingyu Wang, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/386,630

(22) Filed: Dec. 21, 2016

(65) Prior Publication Data

US 2017/0103497 A1    Apr. 13, 2017

Related U.S. Application Data

(63) Continuation of application No. PCT/CN2014/080967, filed on Jun. 27, 2014.

(51) Int. Cl.
H04N 9/083 (2006.01)
H04N 3/14 (2006.01)
(Continued)

(52) U.S. Cl.
CPC .......... *G06T 3/4015* (2013.01); *G06T 5/003* (2013.01); *H01L 27/14621* (2013.01); *H04N 5/2353* (2013.01); *H04N 9/045* (2013.01)

(58) Field of Classification Search
None
See application file for complete search history.

(56) References Cited

U.S. PATENT DOCUMENTS

2012/0314100 A1    12/2012    Frank

FOREIGN PATENT DOCUMENTS

| CN | 102075688 A | 5/2011 |
| CN | 102122388 A | 7/2011 |
(Continued)

OTHER PUBLICATIONS

Zhao, Xingmei et al., Realization of the Bilinear Interpolation Method in Color Difference Space for Digital Cameras, Electronic Science and Technology, 2009, vol. 22, Issue 4, pp. 57-59, China.
(Continued)

*Primary Examiner* — Stephen Coleman
(74) *Attorney, Agent, or Firm* — Anova Law Group, PLLC

(57) ABSTRACT

The present disclose provides a Bayer color filter array based high dynamic range video recording method and device. The method includes configuring different photosensitive times for exposure according to odd-numbered dual columns and even-numbered dual columns, and obtaining an image frame with different exposure values of the odd-numbered dual columns and even-numbered dual columns; decomposing the image frame into an underexposure image frame and an overexposure image frame, where underexposure dual columns and missing dual columns are alternatingly distributed in the underexposure image frame, and overexposure dual columns and missing dual columns are alternatingly distributed in the overexposure image frame. The method also includes acquiring recovered pixel values of pixel points of the missing dual columns in the underexposure image frame and the overexposure image frame; and merging the overexposure image frame and the underexposure image frame to obtain a high dynamic range frame.

20 Claims, 8 Drawing Sheets

(51) Int. Cl.
*H04N 5/335* (2011.01)
*H04N 9/04* (2006.01)
*G06T 3/40* (2006.01)
*H04N 5/235* (2006.01)
*G06T 5/00* (2006.01)
*H01L 27/146* (2006.01)

(56) References Cited

FOREIGN PATENT DOCUMENTS

| CN | 102647565 A | 8/2012 |
| CN | 102970549 A | 3/2013 |
| CN | 104168403 A | 11/2014 |
| JP | 2014030073 A | 2/2014 |

OTHER PUBLICATIONS

The World Intellectual Property Organization (WIPO) International Search Report for PCT/CN2014/080967 dated Feb. 27, 2015 p. 1-6.

| R1 | G2 | R3 | G4 | R5 | G6 |
|---|---|---|---|---|---|
| G7 | B8 | G9 | B10 | G11 | B12 |
| R13 | G14 | R15 | G16 | R17 | G18 |
| G19 | B20 | G21 | B22 | G23 | B24 |
| R25 | G26 | R27 | G28 | R29 | G30 |
| B31 | G32 | B33 | G34 | B35 | G36 |

Fig. 4

BAYER COLOR FILTER ARRAY BASED HIGH DYNAMIC RANGE VIDEO RECORDING METHOD AND DEVICE

CROSS-REFERENCES TO RELATED APPLICATIONS

This application is a continuation application of International Application No. PCT/CN2014/080967, filed with the State Intellectual Property Office of P. R. China on Jun. 27, 2014, the entire contents of which are incorporated herein by reference.

FIELD OF THE INVENTION

The present invention relates to the field of high dynamic range (HDR) video recording technologies and, in particular, to a Bayer color filter array based high dynamic range video recording method and device.

BACKGROUND

For a digital camera, when capturing images in a large lighting ratio environment, an ordinary camera cannot record extremely light or dark details due to being limited by a dynamic range, while HDR video recording can obtain better light and shade levels than the normal shooting in high light and low light regions. A dynamic range of an actual scene is usually above 100 dB, and a sensor is a core imaging component in a digital imaging apparatus. A sensor element employed by the conventional digital camera includes a Charge-Coupled Device (CCD) or a Complementary Metal Oxide Semiconductor (CMOS) device, which generally can only have a dynamic range of about 60 dB. If a sensor with a narrower dynamic range is employed to record a scene with a wider dynamic range, multiple images need to be generated. Taking a 100 dB scene as an example, it is possible to first increase a shutter speed to shoot an underexposure photo of 0-60 dB, then to decrease the shutter speed to shoot an overexposure photo of 40-100 dB, and finally to fuse the two photos into one photo by re-calculating a gray scale mapping relationship.

Existing manufacturers capture HDR video by using high frame-rate sensors, which can continuously capture several images with different exposure values at a high speed, and synthesize the images into one image in HDR format. After multiple frames of images are captured, it is necessary to use a special HDR algorithm to merge the multiple frames into one frame. However, when capturing multiple images of a moving subject, a ghost effect may occur in the HDR image.

A modern CMOS sensor generally has a color filter array structure, and an image captured through a Bayer filter array is called a Bayer diagram for short. Each pixel records monochromatic information of 10-14 bits, and RGB trichromatic information needs to be calculated through interpolation between the current pixel and its surrounding pixels.

The existing method of capturing HDR video mainly includes two key technical features, multi-exposure frame capture and an HDR frame-merging algorithm. The multi-exposure frame capture obtains multiple frames of picture through a high-speed continuous shooting with different exposure values. There are two disadvantages: on the one hand, if there is an object moving in the scene at a high speed, it is impossible to make point-by-point matching between two frames, and motion blurring is easy to occur in a merged picture; on the other hand, the high-speed continuous shooting requires an extremely high frame rate, which limits a lower limit of the shutter for video shooting.

The HDR algorithm first estimates a luminance response function of the camera based on multiple exposure frames, then calculates a new gray scale table by gray scale mapping, and finally calculates a new HDR image. Because estimating the luminance response function of the camera generally needs to conduct parameter estimation on all gray scales, while the calculation complexity may be acceptable for an 8-bit image (256 gray scales), the calculation amount is too great for the Bayer diagram (14 bits), and thus the luminance response function cannot be directly applied to HDR video recording. Weighted average is another common frame-merging method. Taking merging of two frames of pictures as an example, a merged pixel value $p_{new}$ may be calculated by using the formula (1):

$$p_{new} = w_1 p_1 + (1-w_1) p_2 \qquad (1)$$

where $P_1$ and $P_2$ are pixel values of a certain designated position on an underexposure map and an overexposure map, respectively, and $W_1$ is a number between 0 and 1, representing the weight that $P_1$ accounts for in a merged pixel. Under the conventional method, factors generally considered when assigning the weights mainly include conventional overexposure and underexposure of the pixel, and it is common to set a threshold to detect abnormity of exposure. The weight of the overexposure or underexposure pixel may be far lower than that of a normal pixel value. By taking an 8-bit image as an example, the weight is calculated by using the formula (2):

$$\omega_1 = \begin{cases} \dfrac{T_1 - p_1}{T_1}, & p_1 < T_1 \\ \dfrac{p_2 - T_2}{255 - T_2}, & p_2 > T_2 \\ \dfrac{1}{2}, & \text{others} \end{cases} \qquad (2)$$

where $T_1$ and $T_2$ are underexposure and overexposure thresholds, respectively. Such a simple distinction between overexposure and underexposure is not good for adaptability to the scene, artifacts may be easy to occur, and unnatural transition may occur in pixel merging.

SUMMARY

A technical problem to be solved in the present disclosure is to provide a Bayer color filter array based high dynamic range video recording method and device, which can overcome the high-speed motion blur problem and reduce the frame rate of high-speed continuous shooting.

To solve the above technical problems, embodiments of the present invention provide a Bayer color filter array based high dynamic range video recording method. The method includes:

configuring different photosensitive times for exposure according to odd-numbered dual columns and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;

obtaining an image frame with different exposure values for the odd-numbered dual columns and the even-numbered dual columns;

decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;

with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;

with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and according to the pixel values of the pixel points on the red, green, and blue channels in the underexposure image frame and the overexposure image frame, merging the overexposure image frame and the underexposure image frame to obtain a high dynamic range image frame.

The step of respectively acquiring on red, green, and blue channels recovered pixel values of pixel points of the missing dual columns in the underexposure image frame comprises:

calculating estimated pixel values of the pixel points of the missing dual columns by using pixel values of pixel points in adjacent underexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

The step of respectively acquiring on the red, green, and blue channels recovered pixel values of pixel points of the missing dual columns in the overexposure image frame as the pixel values of the corresponding pixel points comprises:

calculating estimated pixel values of the pixel points of the missing dual columns by using pixel values of pixel points in adjacent overexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

The interpolation includes bilinear interpolation or cubic interpolation.

The step of merging the overexposure image frame and the underexposure image frame to obtain a high dynamic range image frame comprises:

obtaining luminance of each pixel point in the underexposure image frame and the overexposure image frame, respectively, according to the pixel values of the pixel points on the red, green, and blue channels;

obtaining a weight value of each pixel point according to the luminance of each pixel point in the underexposure image frame and the overexposure image frame; and merging the overexposure image frame and the underexposure image frame according to the weight value of each pixel point to obtain a high dynamic range image frame.

The step of obtaining a weight value of each pixel point according to the luminance of each pixel point in the underexposure image frame and the overexposure image frame comprises:

calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup(P_1 < T_1)} P_{2,x},$$

$$T_{2,new} = \min_{x \in \cup(P_2 > T_2)} P_{1,x}$$

where $P_1$ and $P_2$ are luminance of pixel points in the underexposure image frame and the overexposure image frame, respectively, $\cup(P_1 < T_1)$ represents a set of all underexposure pixels less than $T_1$ in $P_1$, and $\cup(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

where $\omega_1$ is a weight value of a pixel point in the underexposure image frame of which the luminance is $P_1$, and $\omega_2$ is a weight value of a pixel point in the overexposure image frame of which the luminance is $P_2$.

The step of merging the overexposure image frame and the underexposure image frame according to the weight value of each pixel point to obtain a high dynamic range image frame further comprises:

performing convolutions on the weight value of each pixel point by using a two-dimensional Gaussian filter; and performing frame merging calculation and making contrast stretching by:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

where $$a_1 = 1 - \frac{|p_1 - 127|}{127}, a_2 = 1 - \frac{|p_2 - 127|}{127},$$

for enhancing the contrast, and $q_{1,i}$ and $q_{2,i}$ are three color channels of an RGB diagram, respectively.

To solve the above technical problem, the embodiments of the present invention further provide a Bayer color filter array based high dynamic range video recording device, and the device includes:

a sensor module for configuring different photosensitive times for exposure according to odd-numbered dual columns and even-numbered dual columns, and for obtaining an image frame with different exposure values of the odd-numbered and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;

a decomposition module connected with the sensor module for decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;

an underexposure pixel recovery module connected with the decomposition module for, with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;

an overexposure pixel recovery module connected with the decomposition module for, with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and a merging module connected with the underexposure pixel recovery module and the overexposure pixel recovery module for, according to the pixel values of the pixel points on the red, green, and blue channels in the underexposure image frame and the overexposure image frame, merging the overexposure image frame and the underexposure image frame to obtain a high dynamic range image frame.

The underexposure pixel recovery module is used for:

calculating estimated pixel values of the pixel points of the missing dual columns by using pixel values of pixel points in adjacent underexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

The overexposure pixel recovery module is used for:

calculating estimated pixel values of the pixel points of the missing dual columns by using pixel values of pixel points in adjacent overexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

The interpolation includes bilinear interpolation or cubic interpolation.

The merging module is used for:

obtaining luminance of each pixel point in the underexposure image frame and the overexposure image frame, respectively, according to the pixel values of the pixel points on the red, green, and blue channels;

obtaining a weight value of each pixel point according to the luminance of each pixel point in the underexposure image frame and the overexposure image frame; and merging the overexposure image frame and the underexposure image frame according to the weight value of each pixel point to obtain a high dynamic range image frame.

The merging module is further used for:

calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup(P_1 < T_1)} P_{2,x},$$

$$T_{2,new} = \min_{x \in \cup(P_2 > T_2)} P_{1,x}$$

where $P_1$ and $P_2$ are luminance of pixel points in the underexposure image frame and the overexposure image frame, respectively, $\cup(P_1 < T_1)$ represents a set of all underexposure pixels less than $T_1$ in $P_1$, and $\cup(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \frac{T_{1,new} - P_1}{T_{1,new}} & P_1 < T_{1,new} \\ 0 & \text{others} \end{cases}$$

-continued $$\omega_2 = \begin{cases} \dfrac{P_2 - T_{2,new}}{255 - T_{2,new}} & P_2 > T_{2,new} \\ 0 & \text{others} \end{cases}$$

where $\omega_1$ is a weight value of a pixel point in the underexposure image frame of which the luminance is $P_1$, and $\omega_2$ is a weight value of a pixel point in the overexposure image frame of which the luminance is $P_2$.

The merging module is further used for:

performing convolutions on the weight value of each pixel point by using a two-dimensional Gaussian filter; and performing frame merging calculation and making contrast stretching by:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

where $$a_1 = 1 - \dfrac{|p_1 - 127|}{127},\ a_2 = 1 - \dfrac{|p_2 - 127|}{127},$$

for enhancing the contrast, and $q_{1,i}$ and $q_{2,i}$ are three color channels of an RGB diagram, respectively.

To solve the above technical problem, the embodiments of the present invention further provide a Bayer color filter array based high dynamic range video recording method, including:

configuring different photosensitive times for exposure according to odd-numbered dual columns and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;

obtaining an image frame with different exposure values for the odd-numbered dual columns and the even-numbered dual columns;

decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;

with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;

with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and according to the pixel values of the pixel points on the red, green, and blue channels in the underexposure image frame and the overexposure image frame, merging the overexposure image frame and the underexposure image frame to obtain a high dynamic range image frame by:

obtaining luminance of each pixel point in the underexposure image frame and the overexposure image frame, respectively, according to the pixel values of the pixel points on the red, green, and blue channels;

obtaining a weight value of each pixel point according to the luminance of each pixel point in the underexposure image frame and the overexposure image frame; and merging the overexposure image frame and the underexposure image frame according to the weight value of each pixel point to obtain a high dynamic range image frame.

The step of respectively acquiring on red, green, and blue channels recovered pixel values of pixel points of the missing dual columns in the underexposure image frame comprises:

calculating estimated pixel values of the pixel points of the missing dual columns by using pixel values of pixel points in adjacent underexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

The step of respectively acquiring on the red, green, and blue channels recovered pixel values of pixel points of the missing dual columns in the overexposure image frame as the pixel values of the corresponding pixel points comprises:

calculating estimated pixel values of the pixel points of the missing dual columns by using pixel values of pixel points in adjacent overexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

The interpolation includes bilinear interpolation or cubic interpolation.

The step of obtaining a weight value of each pixel point according to the luminance of each pixel point in the underexposure image frame and the overexposure image frame comprises:

calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup (P_1 T_1)} P_{2,x},$$

$$T_{2,new} = \min_{x \in \cup (P_2 T_2)} P_{1,x}$$

where $P_1$ and $P_2$ are luminance of pixel points in the underexposure image frame and the overexposure image frame, respectively, $\cup(P_1 < T_1)$ represents a set of all underexposure pixels less than $T_1$ in $P_1$, and $\cup(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

where $\omega_1$ is a weight value of a pixel point in the underexposure image frame of which the luminance is $P_1$, and $\omega_2$ is a weight value of a pixel point in the overexposure image frame of which the luminance is $P_2$.

The step of merging the overexposure image frame and the underexposure image frame according to the weight value of each pixel point to obtain a high dynamic range image frame further comprises:

performing convolutions on the weight value of each pixel point by using a two-dimensional Gaussian filter; and performing frame merging calculation and making contrast stretching by:

$$q_{new,i} = (1-\omega_1) a_1 q_{1,i} + (1-\omega_2) a_2 q_{2,i} + \omega_1 q_{2,i} + \omega_2 q_{1,i} \quad i=1,2,3$$

where $$a_1 = 1 - \frac{|p_1 - 127|}{127}, \quad a_2 = 1 - \frac{|p_2 - 127|}{127},$$

for enhancing the contrast, and $q_{1,i}$ and $q_{2,i}$ are three color channels of an RGB diagram, respectively.

Through the above solutions, compared with the conventional approaches, the present disclosure provides certain beneficial effects, including: different photosensitive times are configured for exposure according to odd-numbered dual columns and even-numbered dual columns, and an image frame with different exposure values of the odd-numbered dual columns and the even-numbered dual columns is obtained; the image frame is decomposed into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame; with respect to the underexposure image frame, recovered pixel values of pixel points of the missing dual columns in the underexposure image frame are acquired as the pixel values of the corresponding pixel points on red, green, and blue channels, respectively, according to pixel values of pixel points in the underexposure dual columns; with respect to the overexposure image frame, recovered pixel values of pixel points of the missing dual columns in the overexposure image frame are acquired as the pixel values of the corresponding pixel points on the red, green, and blue channels, respectively, according to pixel values of pixel points in the overexposure dual columns; and according to the pixel values of the pixel points on the red, green, and blue channels in the underexposure image frame and the overexposure image frame, the overexposure image frame and the underexposure image frame are merged to obtain a high dynamic range image frame, which can overcome the high-speed motion blur problem and reduce the frame rate of high-speed continuous shooting.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

FIG. 4 is a schematic diagram of a method for acquiring pixel estimation values of pixel points of the missing dual columns in step S12 according to the first embodiment of the present invention;

DETAILED DESCRIPTION

Figure 1:
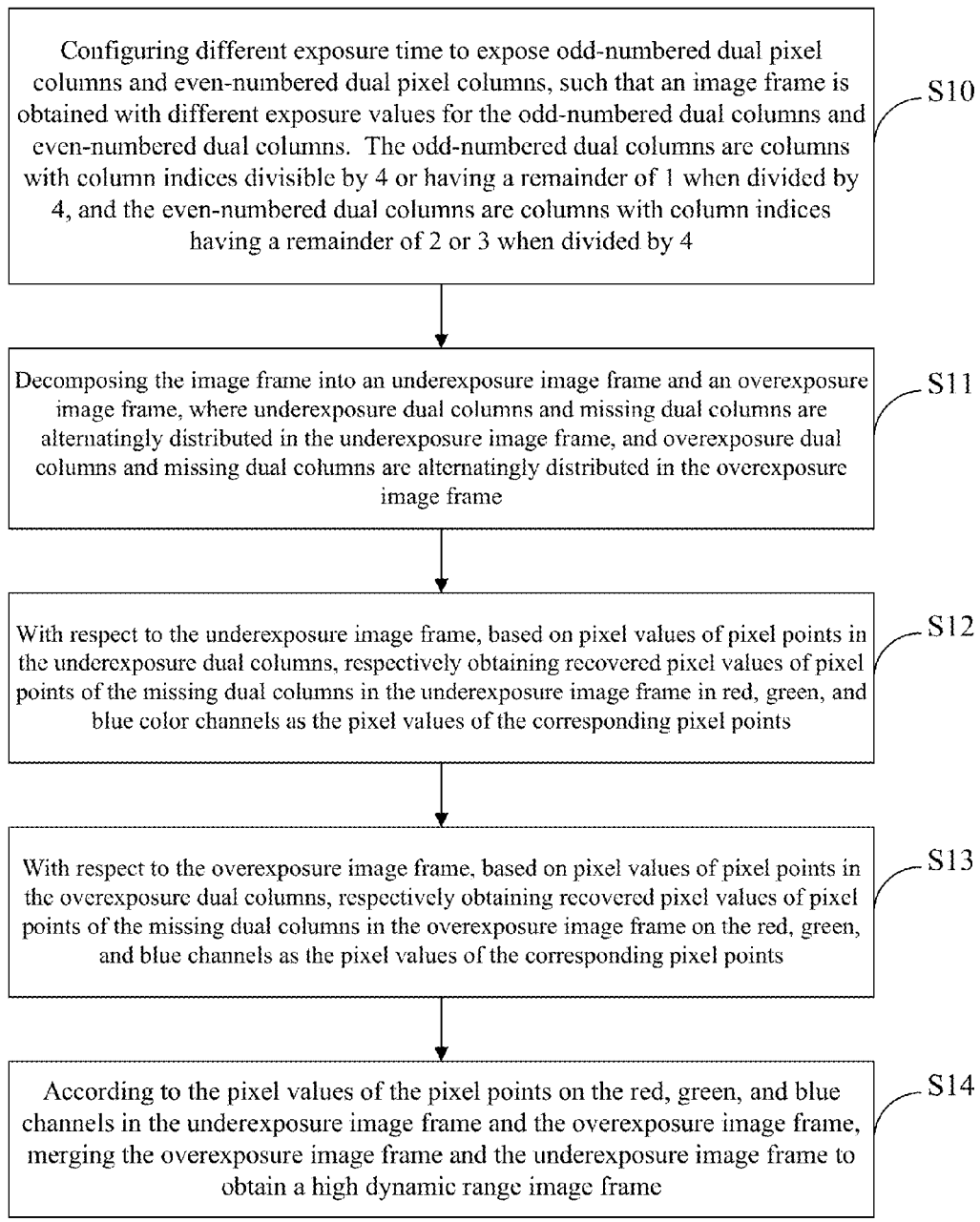
FIG. 1 is a schematic flow chart of a Bayer color filter array based high dynamic range video recording method according to a first embodiment of the present invention.

Referring to FIG. 1, FIG. 1 is a schematic flow chart of a Bayer color filter array based high dynamic range video recording method according to a first embodiment of the present invention. As shown in FIG. 1, the Bayer color filter array based high dynamic range video recording method includes the following steps.

Step S10: Different exposure time is configured to expose odd-numbered dual pixel columns and even-numbered dual pixel columns, such that an image frame is obtained with different exposure values for the odd-numbered dual columns and even-numbered dual columns. The odd-numbered dual columns are columns with column indices divisible by 4 or having a remainder of 1 when divided by 4, and the even-numbered dual columns are columns with column indices having a remainder of 2 or 3 when divided by 4.

In a Bayer diagram employed in the present disclosure, a color filter unit includes one R unit, one B unit, and two G units, which are 2×2 arranged in space. That is, each color filter unit occupies two rows and two columns. Specifically, a column label or column index is defined as c, 0<=c<=C, where C+1 is the total number of columns of the image frame, and C+1 is generally an even number. Preferably, C+1 is a multiple of 4. Thus, the odd-numbered dual columns are defined as (c1, c2), where c1 is divisible by 4, c2 has a remainder of 1 when divided by 4, and c2=c1+1. The even-numbered dual columns are defined as (c3, c4), where c3 has a remainder of 2 when divided by 4, c4 has a remainder of 3 when divided by 4, and c4=c3+1. Such configuration ensures that the odd-numbered dual columns and the even-numbered dual columns completely contain a set of Bayer color arrays.

Figure 2:
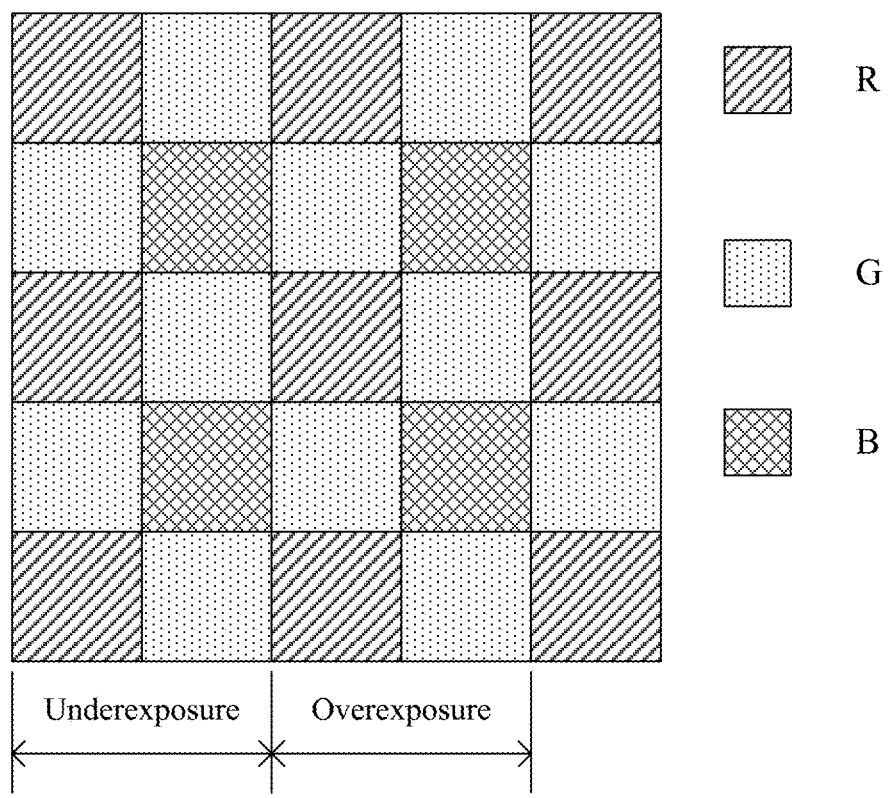
FIG. 2 is a Bayer diagram of exposure according to the first embodiment of the present invention.

In step S10, as shown in FIG. 2, by taking dual columns as the unit, an image frame with different exposure values for odd-numbered dual columns and the even-numbered dual columns is obtained by respectively exposing the odd-numbered dual columns and the even-numbered dual columns. That is, underexposing the odd-numbered dual columns and overexposing the even-numbered dual columns. For example, by designing a sensor configured with different photosensitive times according to the odd-numbered and even-numbered dual columns, two image frames with different exposure values can be obtained and, at this point, each image frame only has half of the width of the original frame. In this way, if the video is shot at a frame rate of 60 frames per second with the conventional method, the same effect can be achieved only at a frame rate of 30 frames per second in the present disclosure. Of course, in other embodiments of the present disclosure, it is also possible to underexpose the even-numbered dual columns and overexpose the odd-numbered dual columns. Such a single-frame multi-exposure method ensures that each column of exposure includes a set of complete color filter units.

Step S11: The image frame is decomposed into an underexposure image frame and an overexposure image frame, where underexposure dual columns and missing dual columns are alternatingly distributed in the underexposure image frame, and overexposure dual columns and missing dual columns are alternatingly distributed in the overexposure image frame.

In step S11, the image frame obtained in step S10 is decomposed to obtain an underexposure image frame and an overexposure image frame. Specifically, in an original image frame, underexposed odd-numbered dual columns are unchanged, and even-numbered dual columns are changed into missing columns to obtain the underexposure image frame. In the original image frame, overexposed even-numbered dual columns are unchanged, and the odd-numbered dual columns are changed into missing columns to obtain the overexposure image frame. Therefore, underexposure dual columns and missing dual columns are alternatingly distributed in the underexposure image frame, and overexposure dual columns and missing dual columns are alternatingly distributed in the overexposure image frame.

Step S12: With respect to the underexposure image frame, based on pixel values of pixel points in the underexposure dual columns, recovered pixel values of pixel points of the missing dual columns in the underexposure image frame are acquired respectively in red, green, and blue color channels as the pixel values of the corresponding pixel points.

Figure 3:
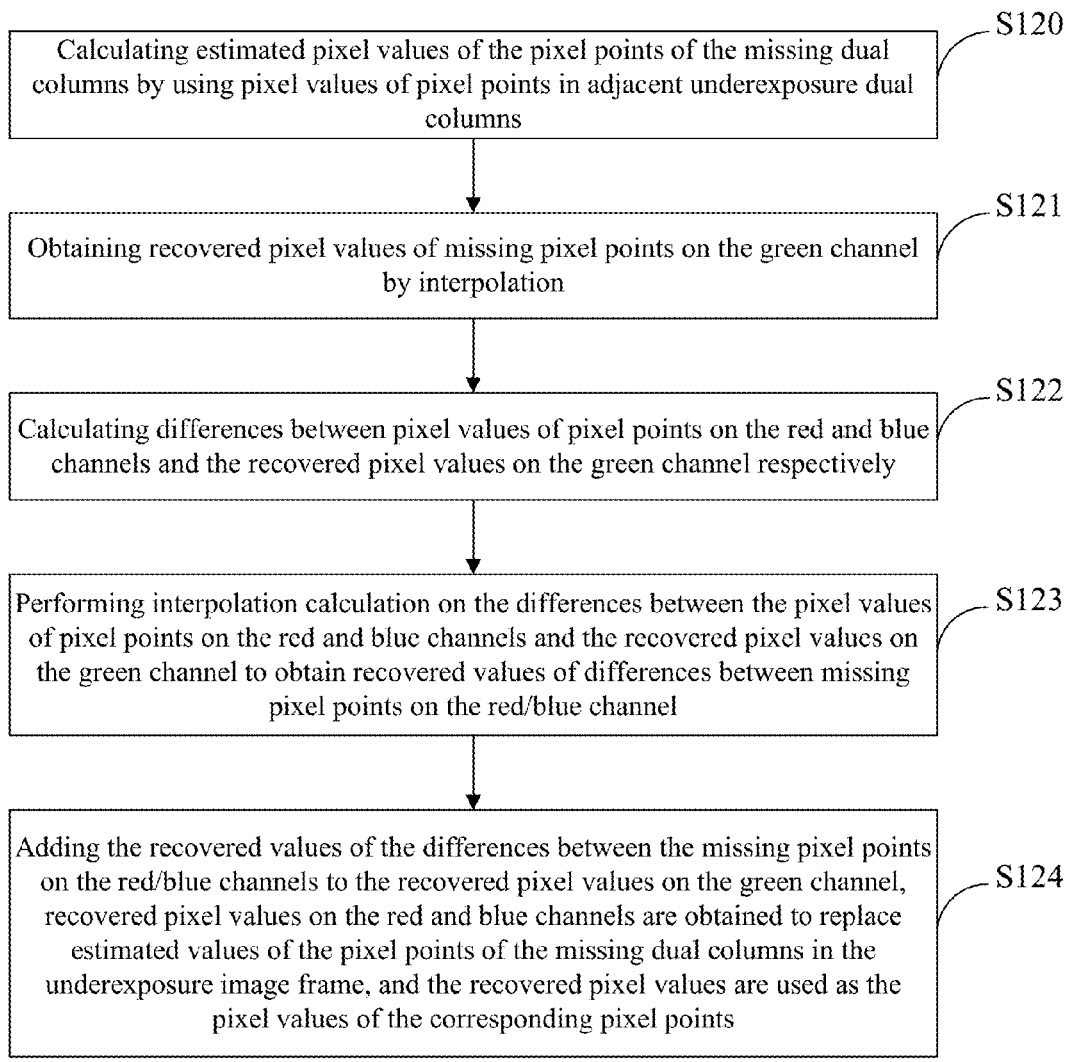
FIG. 3 is a schematic flow chart of an implementation of step S12 according to the first embodiment of the present invention.

More specifically, with respect to the underexposure image frame, as shown in FIG. 3, recovering RGB information in the underexposure image frame includes:

Step S120: Estimated pixel values of the pixel points of the missing dual columns are calculated by using pixel values of pixel points in adjacent underexposure dual columns.

In the underexposure image frame, the even-numbered dual columns are missing columns, and in step S120, interpolation calculation is performed on missing values of the even-numbered dual columns by using adjacent odd-numbered dual columns. As shown in FIG. 4, for example, an average interpolation is used, that is, R3=(R1+R5)/2, G4=(G2+G6)/2, G9=(G7+G11)/2, B10=(B8+B12)/2.

Step S121: Recovered pixel values of missing pixel points on the green channel are obtained by interpolation.

Because information of the green channel in the underexposure image frame is more than that of the red and blue channels, the information of the green channel is first recovered by an interpolation method. The interpolation method includes bilinear interpolation or cubic interpolation. Of course, in other embodiments of the present invention, it is also possible to recover the information of the green channel by other interpolation methods.

Step S122: Differences between pixel values of pixel points on the red and blue channels and the recovered pixel values on the green channel are calculated respectively.

Figure 5:
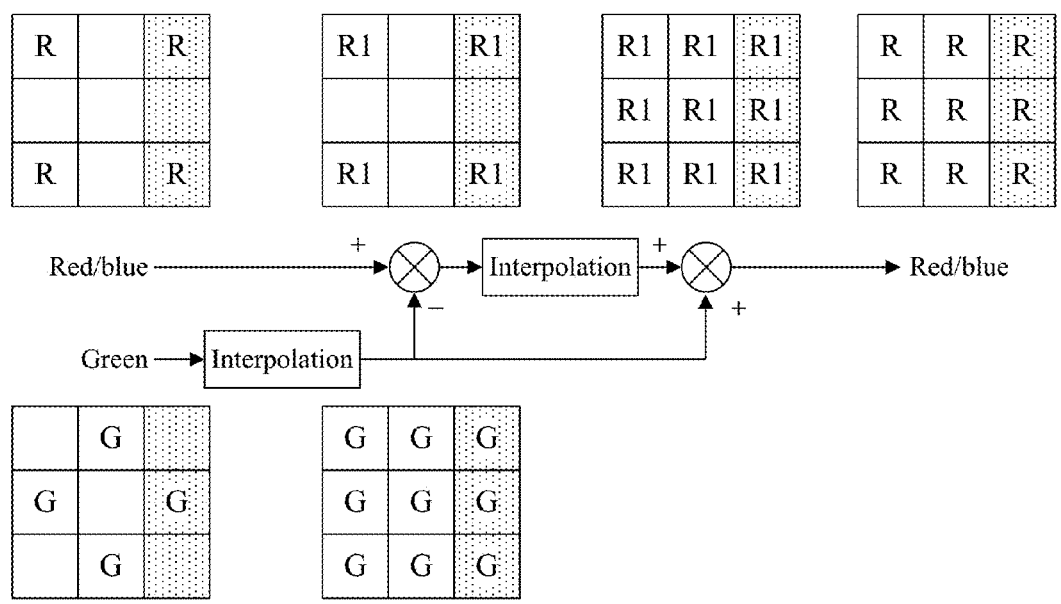
FIG. 5 is a schematic diagram of a method for acquiring recovered pixel values of pixel points on a red channel in step S12 according to the first embodiment of the present invention.

Because the number of pixels of the red and blue channels in the underexposure image frame is relatively small, the pixels of the red and blue channels are not recovered directly. Rather, the differences between known pixels of the red and blue channels and the green channel are used to recover the pixels of the red and blue channels. Specifically, as shown in FIG. 5, using the red channel as an example, the difference R1 between the known pixels of the red channel and the green channel is denoted as R1=R−G, where R is a red pixel value in an imaging position, and G is a recovered pixel value of the green channel in the corresponding position.

Step S123: Interpolation calculation is performed on the differences between the pixel values of pixel points on the red and blue channels and the recovered pixel values on the green channel to obtain recovered values of differences between missing pixel points on the red/blue channel. That is, a difference R1 between the known pixels of the red channel and the green channel is interpolated to obtain a recovered value of a difference of missing pixel points on the red channel.

Step S124: The recovered values of the differences between the missing pixel points on the red/blue channels are added to the recovered pixel values on the green channel, recovered pixel values on the red and blue channels are obtained to replace estimated values of the pixel points of the missing dual columns in the underexposure image frame, and the recovered pixel values are used as the pixel values of the corresponding pixel points.

After the recovered value R1 of the difference of the missing pixel points on the red channel is obtained, an estimated value R of a red pixel is the sum of the recovered value R1 of the difference of the missing pixel points on the red channel and the recovered pixel value G on the green channel, that is, R=R1+G. In the recovery information in FIG. 5, one column on the right side is a missing column. When the missing column is on the left side, it is easy to use a similar calculation method to obtain a recovered pixel value of the missing column. At this point, the recovered pixel value of the missing column can replace the missing value of the even-numbered dual columns obtained through interpolation calculation on the adjacent odd-numbered dual columns. The blue channel can be processed with the same method shown in FIG. 5, which is not repeated herein. Thus, the recovered pixel values of the missing columns on the red, green, and blue channels in the underexposure image frame are obtained to be used in the subsequent frame-merging process.

Referring to FIG. 1, step S13: with respect to the overexposure image frame, based on pixel values of pixel points in the overexposure dual columns, recovered pixel values of pixel points of the missing dual columns in the overexposure image frame are obtained respectively on the red, green, and blue channels as the pixel values of the corresponding pixel points.

Recovered pixel values of missing pixel points on the green channel are obtained by interpolation; and the differences between pixel values of pixel points on the red and blue channels and the recovered pixel values on the green channel can be calculated respectively. Interpolation calculation is performed on the differences between the pixel values of pixel points on the red and blue channels and the recovered pixel values on the green channel to obtain recovered values of differences between missing pixel points on the red/blue channel. The recovered values of the differences between the missing pixel points on the red/blue channel are added to the recovered pixel values on the green channel to obtain recovered pixel values on the red and blue channels, so as to replace estimated values of the pixel points of the missing dual columns in the overexposure image frame, and to be used as the pixel values of the corresponding pixel points. Specifically, this may be similar to or same as the method for obtaining the recovered pixel values of the pixel points of the missing dual columns in the overexposure image frame as shown in FIG. 5, details of which are not repeated herein. Thus, the recovered pixel values of the missing columns on the red, green, and blue channels in the overexposure image frame can be obtained to be used in the subsequent frame-merging process.

Step S14: According to the pixel values of the pixel points on the red, green, and blue channels in the underexposure image frame and the overexposure image frame, the overexposure image frame and the underexposure image frame are merged to obtain a high dynamic range image frame.

Figure 6:
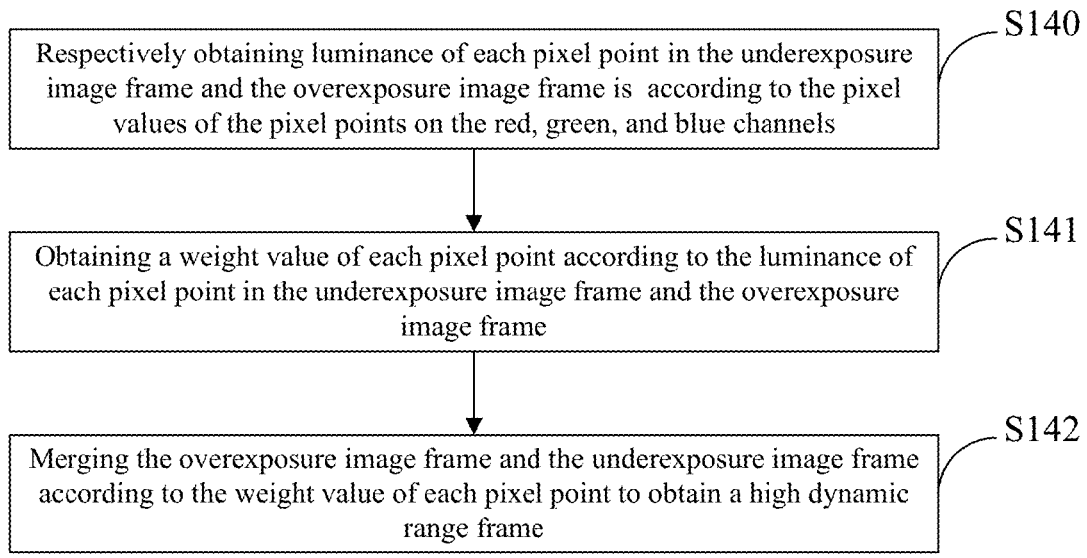
FIG. 6 is a schematic flow chart of an implementation of step S14 according to the first embodiment of the present invention.

Considering the problem of artifacts and unnatural transition in the frame-merging calculation employed in conventional HDR video, the cause of the artifacts is that, in frame merging, a luminance inversion phenomenon can present in a transition zone. The conventional method cannot avoid this problem when selecting high light and low light thresholds, and this problem may emerge in a region having a great change of light. The unnatural transition is caused by not considering isolated points and isolated blocks. Because a natural scene often has complicated lighting, it is easy to lead to interweaving of overexposure and underexposure regions, and simple merging easily causes the problem of unnatural transition. According to the present disclosure, as shown in FIG. 6, merging the overexposure image frame and the underexposure image frame to obtain a high dynamic range frame includes the following steps.

Step S140: Luminance of each pixel point in the underexposure image frame and the overexposure image frame is respectively obtained according to the pixel values of the pixel points on the red, green, and blue channels.

In step S140, the luminance or brightness can be acquired through any appropriate means. For example, the luminance may be acquired as: (R+G+B)/3. Other methods may also be used to acquire the luminance according to the pixel values of the pixel points on the red, green, and blue channels.

Step S141: A weight value of each pixel point is obtained according to the luminance of each pixel point in the underexposure image frame and the overexposure image frame.

In step S141, based on a preset underexposure threshold $T_1$ and overexposure threshold $T_2$ a self-adaptive underexposure threshold $T_{1,new}$ and a self-adaptive overexposure threshold $T_{2,new}$ can be calculated by using the following equations:

$$T_{1,new} = \max_{x \in \cup (P_1 < T_1)} P_{2,x},$$

$$T_{2,new} = \min_{x \in \cup (P_2 > T_2)} P_{1,x}$$

where P1 and P2 are luminance of pixel points in the underexposure image frame and the overexposure image frame, respectively, $\cup(P_1<T_1)$ represents a set of all underexposure pixels less than T1 in P1, and $\cup(P_2>T_2)$ represents a set of all overexposure pixels greater than T2 in P2. It is thus clear that $T_{1,new}$ indicates a pixel value upper limit in P2 corresponding to an underexposure position in P1, and $T_{2,new}$ indicates a pixel value lower limit in P1 corresponding to an overexposure position in P2.

Then, weight of each pixel point is calculated by using the following equations according to the self-adaptive underexposure threshold $T_{1,new}$ and the self-adaptive overexposure threshold $T_{2,new}$:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

where $\omega_1$ is a weight value of a pixel point in the underexposure image frame of which the luminance is P1, and $\omega_2$ is a weight value of a pixel point in the overexposure image frame of which the luminance is P2.

Step S142: The overexposure image frame and the underexposure image frame are merged according to the weight value of each pixel point to obtain a high dynamic range frame.

In order to avoid the problem of unnatural transition caused by interweaving of overexposure and underexposure regions, Gaussian blurring is performed on weight diagrams $\omega_1$ and $\omega_2$. In step S142, at first, a convolution operation is performed on the weight value of each pixel point by using a two-dimensional Gaussian filter. Specifically, a two-dimensional Gaussian filter of which the window width is H and the variance is $\sigma$ is employed to perform convolution with $\omega_1$ and $\omega_2$. H is related to the size of the image frame, which is generally selected to be $\sigma=H/6$; and other values may also be selected for the variance $\sigma$.

Then, frame merging calculation is performed by using the following equation, and contrast stretching is also performed:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

where $$a_1 = 1 - \frac{|p_1 - 127|}{127}, \quad a_2 = 1 - \frac{|p_2 - 127|}{127},$$

for enhancing the contrast, and $q_{1,i}$ and $q_{2,i}$ are three color channels of an RGB diagram, respectively.

Figure 7:
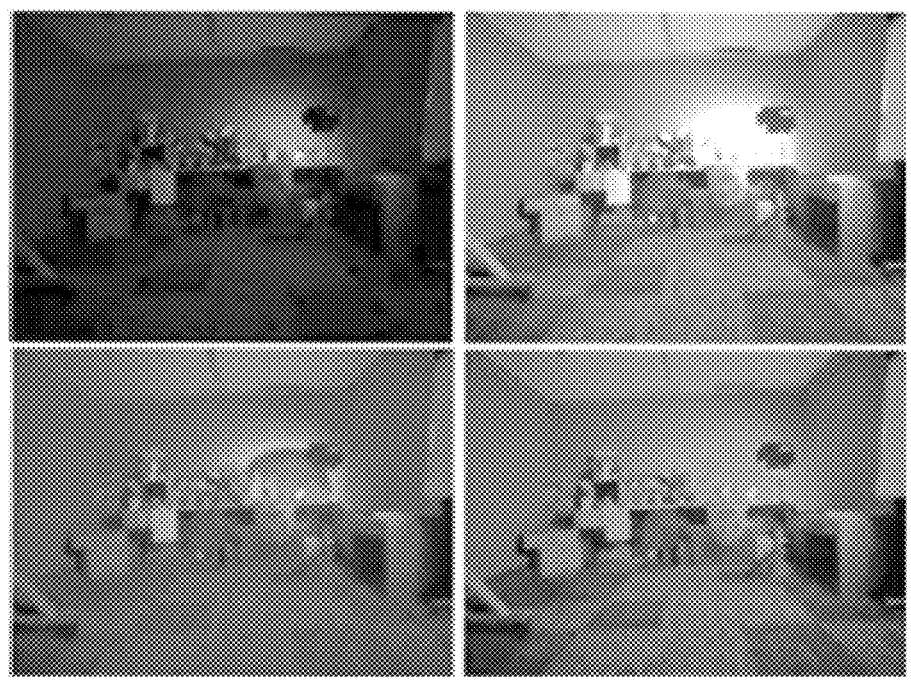
FIG. 7 is a schematic result of a Bayer color filter array based high dynamic range video recording method according to the present invention.

Upon comparison between the pictures shot with the conventional method and with the method according to the present disclosure, as shown in FIG. 7, the picture at the top left corner is an underexposure picture, the picture at the top right corner is an overexposure picture, the picture at the bottom left corner is a picture merged with the conventional method, and the picture at the bottom right corner is a picture acquired with the method according to the present invention. It can be seen that the picture shot with the method according to the present disclosure has better contrast, does not have artifacts, has a natural transition zone, and is better than the conventional method.

According to the embodiments of the present invention, different photosensitive times are configured for exposure according to odd-numbered and even-numbered dual columns, and an image frame with different exposure values of the odd-numbered and even-numbered dual columns is obtained. The image frame is decomposed into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame. With respect to the underexposure image frame, based on pixel values of pixel points in the underexposure dual columns, recovered pixel values of pixel points of the missing dual columns in the underexposure image frame are acquired respectively on red, green, and blue channels as the pixel values of the corresponding pixel points. With respect to the overexposure image frame, based on pixel values of pixel points in the overexposure dual columns, recovered pixel values of pixel points of the missing dual columns in the overexposure image frame are acquired respectively on the red, green, and blue channels as the pixel values of the corresponding pixel points. According to the pixel values of the pixel points on the red, green, and blue channels in the underexposure image frame and the overexposure image frame, the overexposure image frame and the underexposure image frame are merged to obtain a high dynamic range frame, which can overcome the high-speed motion blur problem and reduce the frame rate of high-speed continuous shooting, and can also solve the problems of artifacts and unnatural transition.

Figure 8:
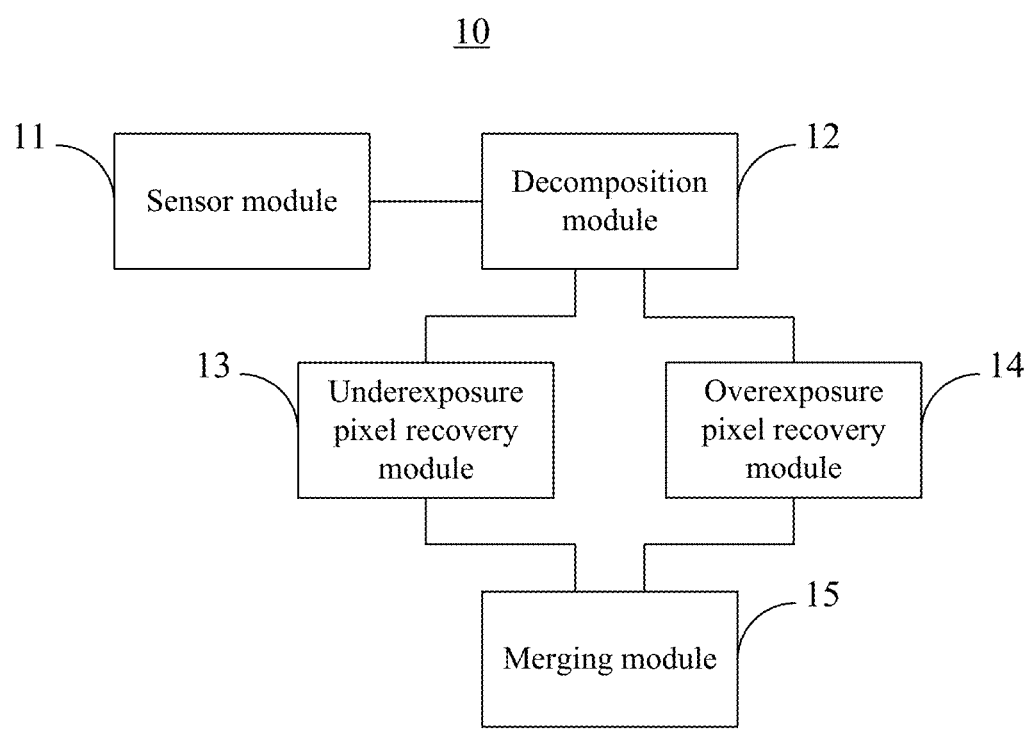
FIG. 8 is a schematic structural diagram of a Bayer color filter array based high dynamic range video recording device according to the first embodiment of the present invention.

Referring to FIG. 8, FIG. 8 is a schematic structural diagram of a Bayer color filter array based high dynamic range video recording device according to the first embodiment of the present invention. As shown in FIG. 8, the Bayer color filter array based high dynamic range video recording device 10 includes: a sensor module 11, a decomposition module 12, an underexposure pixel recovery module 13, an overexposure pixel recovery module 14, and a merging module 15. The sensor module 11 is used for configuring different photosensitive times for exposure according to odd-numbered and even-numbered dual columns and obtaining an image frame with different exposure values for the odd-numbered and even-numbered dual columns. The decomposition module 12 is connected with the sensor module 11 for decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame. The underexposure pixel recovery module 13 is connected with the decomposition module 12 for, with respect to the underexposure image frame, based on pixel values of pixel points in the underexposure dual columns, acquiring recovered pixel values of pixel points of the missing dual columns in the underexposure image frame as the pixel values of the corresponding pixel points on red, green, and blue channels, respectively. The overexposure pixel recovery module 14 is connected with the decomposition module 12 for, with respect to the overexposure image frame, based on pixel values of pixel points in the overexposure dual columns, acquiring recovered pixel values of pixel points of the missing dual columns in the overexposure image frame as the pixel values of the corresponding pixel points on the red, green, and blue channels, respectively. The merging module 15 is connected with the underexposure pixel recovery module 13 and the overexposure pixel recovery module 14 for, based on the pixel values of the pixel points on the red, green, and blue channels in the underexposure image frame and the overexposure image frame, merging the overexposure image frame and the underexposure image frame to obtain a high dynamic range frame.

In a Bayer diagram employed in the present disclosure, a color filter unit includes one R unit, one B unit, and two G units, which are 2×2 arranged in space. That is, each color filter unit occupies two rows and two columns. The sensor module 11 obtains an image frame with different exposure values for odd-numbered dual columns and even-numbered dual columns when exposing the odd-numbered dual columns and the even-numbered dual columns respectively, that is, underexposing the odd-numbered dual columns and overexposing the even-numbered dual columns. Such an exposure method ensures that each column of exposure definitely includes a set of complete color filter units. The decomposition module 12 decomposes the image frame and obtains an underexposure image frame and an overexposure image frame. Specifically, in an original image frame, underexposed odd-numbered dual columns are unchanged, and even-numbered dual columns are changed into missing dual columns to obtain the underexposure image frame. In the original image frame, overexposed even-numbered dual columns are unchanged, and the odd-numbered dual columns are changed into missing dual columns to obtain the overexposure image frame. Therefore, underexposure dual columns and missing dual columns are alternatingly distributed in the underexposure image frame, and overexposure dual columns and missing dual columns are alternatingly distributed in the overexposure image frame.

Specifically, the underexposure pixel recovery module 13 is used for: calculating estimated pixel values of the pixel points of the missing dual columns by using pixel values of pixel points in adjacent underexposure dual columns. For example, an average interpolation method can be used. Considering that information of the green channel in the underexposure image frame is more than that of the red and blue channels, at first, recovered pixel values of missing pixel points on the green channel are obtained through interpolation. The interpolation method includes bilinear interpolation or cubic interpolation. Other interpolation methods may also be used to recover the information of the green channel. Then, differences between pixel values of pixel points on the red and blue channels and the recovered pixel values on the green channel are calculated respectively. Further, interpolation calculation is performed on the differences between the pixel values of pixel points on the red and blue channels and the recovered pixel values on the green channel to obtain recovered values of differences between missing pixel points on the red/blue channel. The interpolation method herein is the same as that described above. That is, the interpolation method includes bilinear interpolation or cubic interpolation. Finally, the recovered values of the differences between the missing pixel points on the red/blue channel are added to the recovered pixel values on the green channel, recovered pixel values on the red and blue channels are obtained to replace estimated values of the pixel points of the missing dual columns in the underexposure image frame, and the recovered pixel values are used as the pixel values of the corresponding pixel points. The blue channel is processed with the same method, which is not repeated herein. Thus, the recovered pixel values of the missing columns on the red, green, and blue channels in the underexposure image frame are obtained to be used in the subsequent frame-merging process.

The overexposure pixel recovery module 14 is used for: calculating estimated pixel values of the pixel points of the missing dual columns by using pixel values of pixel points in adjacent overexposure dual columns. For example, an average interpolation method may be used. Considering that information of the green channel in the underexposure image frame is more than that of the red and blue channels, at first, recovered pixel values of missing pixel points on the green channel are obtained through interpolation. The interpolation method includes bilinear interpolation or cubic interpolation, and other interpolation methods may also be used to recover the information of the green channel. Then, differences between pixel values of pixel points on the red and blue channels and the recovered pixel values on the green channel are calculated, respectively; and interpolation calculation is performed on the differences between the pixel values of pixel points on the red and blue channels and the recovered pixel values on the green channel to obtain recovered values of differences between missing pixel points on the red/blue channel. The interpolation method herein is the same as that described above. That is, the interpolation method includes bilinear interpolation or cubic interpolation. Finally, the recovered values of the differences between the missing pixel points on the red/blue channel are added to the recovered pixel values on the green channel, recovered pixel values on the red and blue channels are obtained to replace estimated values of the pixel points of the missing dual columns in the overexposure image frame, and the recovered pixel values are used as the pixel values of the corresponding pixel points. The blue channel is processed with the same method, which is not repeated herein. Finally, the recovered pixel values of the missing columns on the red, green, and blue channels in the overexposure image frame are obtained to be used in the subsequent processing of frame-merging.

The merging module 15 is used for: based on the pixel values of the pixel points on the red, green, and blue channels, obtaining luminance of each pixel point in the underexposure image frame and the overexposure image frame, respectively. The luminance can be obtained by any appropriate means. For example, the luminance may be obtained by (R+G+B)/3, and other methods may also be used to obtain the luminance according to the pixel values of the pixel points on the red, green, and blue channels. Then, a weight value of each pixel point is acquired according to the luminance of each pixel point in the underexposure image frame and the overexposure image frame. Specifically, a self-adaptive underexposure threshold $T_{1,new}$ and a self-adaptive overexposure threshold $T_{2,new}$ are calculated by using the following equations according to a preset underexposure threshold $T_1$ and overexposure threshold $T_2$:

$$T_{1,new} = \max_{x \in \cup(P_1 < T_1)} P_{2,x},$$

$$T_{2,new} = \min_{x \in \cup(P_2 > T_2)} P_{1,x}$$

where P1 and P2 are luminance of pixel points in the underexposure image frame and the overexposure image frame, respectively, $\cup(P_1 < T_1)$ represents a set of all underexposure pixels less than T1 in P1, and $\cup(P_2 > T_2)$ represents a set of all overexposure pixels greater than T2 in P2. Thus, $T_{1,new}$ indicates a pixel value upper limit in P2 corresponding to an underexposure position in P1, and $T_{2,new}$ indicates a pixel value lower limit in P1 corresponding to an overexposure position in P2. Then, a weight of each pixel point is calculated by using the following equations according to the self-adaptive underexposure threshold $T_{1,new}$ and the self-adaptive overexposure threshold $T_{2,new}$:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

where $\omega_1$ is a weight value of a pixel point in the underexposure image frame of which the luminance is P1, and $\omega_2$ is a weight value of a pixel point in the overexposure image frame of which the luminance is P2. Finally, the overexposure image frame and the underexposure image frame are merged according to the weight value of each pixel point to obtain a high dynamic range frame.

In order to avoid the problem of unnatural transition caused by interweaving of overexposure and underexposure regions, Gaussian blurring is performed on weight diagrams $\omega_1$ and $\omega_2$. That is, convolutions are performed on the weight value of each pixel point by using a two-dimensional Gaussian filter. Specifically, a two-dimensional Gaussian filter of which the window width is H and the variance is σ is employed to perform convolutions with $\omega_1$ and $\omega_2$. H is related to the size of the image frame, which is generally selected to be σ=H/6; and other values may also be selected for the variance σ. Then, frame merging calculation is performed by using the following equation, and contrast stretching is also performed:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

where $$a_1 = 1 - \frac{|p_1 - 127|}{127}, \quad a_2 = 1 - \frac{|p_2 - 127|}{127},$$

for enhancing the contrast, and $q_{1,i}$ and $q_{2,i}$ are three color channels of an RGB diagram, respectively. Accordingly, an image created by the method according to the present invention has better contrast, does not have artifacts, has a natural transition zone, and is better than the conventional method.

Thus, according to the present disclosure, different photosensitive times are configured for exposure according to odd-numbered dual columns and even-numbered dual columns, and an image frame with different exposure values of the odd-numbered and even-numbered dual columns is obtained. The image frame is decomposed into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame. With respect to the underexposure image frame, based on pixel values of pixel points in the underexposure dual columns, recovered pixel values of pixel points of the missing dual columns in the underexposure image frame are acquired respectively on red, green, and blue channels as the pixel values of the corresponding pixel points. With respect to the overexposure image frame, based on pixel values of pixel points in the overexposure dual columns, recovered pixel values of pixel points of the missing dual columns in the overexposure image frame are acquired respectively on the red, green, and blue channels as the pixel values of the corresponding pixel points. According to the pixel values of the pixel points on the red, green, and blue channels in the underexposure image frame and the overexposure image frame, the overexposure image frame and the underexposure image frame are merged to obtain a high dynamic range frame, which can overcome the high-speed motion blur problem and reduce the frame rate of high-speed continuous shooting, and further weight processing when the image frames are merged can also solve the problems of artifacts and unnatural transition.

In the several embodiments provided in the present disclosure, it should be understood that the system, device and method disclosed may be implemented in other manners. The disclosed device described above is only for illustrative purposes. For example, dividing the various modules or units is merely division of a logical function and other dividing methods may be used in actual implementation. For example, a plurality of units or components may be combined or integrated into another system, or some features may be omitted or not performed. In addition, the mutual coupling or direct coupling or communicative connections displayed or discussed may be implemented by indirect coupling or communicative connections among certain interfaces, devices, or units, which may be electrically, mechanically or other forms.

The units described as separate parts may be or may not be physically separate, and parts displayed as a unit may be or may not be a physical unit, may be located in one location, or may be distributed over a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, all or a part of the technical solutions may be implemented in a form of a software product. The computer software product is stored in a storage medium, and includes computer instructions for instructing a computer apparatus (e.g., a personal computer, a server, or a network device) or a processor to perform all or a part of the steps of the methods described in the embodiments of the present invention. The storage medium includes: a USB flash drive, a portable hard disk, Read-Only Memory (ROM), Random Access Memory (RAM), a magnetic disk, an optical disc, or any medium that can store program code.

The above descriptions are merely embodiments of the present invention, but are not intended to limit the scope of the present invention. Any equivalent structure or equivalent process variation performed by using contents of the specification and the drawings of the present disclosure, or direct or indirect application of the present invention in other related technical fields, should be likewise included in the protection scope of the present invention.

What is claimed is:

1. A Bayer color filter array based high dynamic range video recording method, comprising:
   configuring different photosensitive times for exposure according to odd-numbered dual columns and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;
   obtaining an image frame with different exposure values for the odd-numbered dual columns and the even-numbered dual columns;
   decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;
   with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;
   with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and
   according to the pixel values of the pixel points on the red, green, and blue channels in the underexposure image frame and the overexposure image frame, merging the overexposure image frame and the underexposure image frame to obtain a high dynamic range image frame.

2. The method according to claim 1, wherein respectively acquiring on the red, green, and blue channels recovered pixel values of pixel points of the missing dual columns in the overexposure image frame as the pixel values of the corresponding pixel points comprises:
   calculating estimated pixel values of the pixel points of the missing dual columns by using pixel values of pixel points in adjacent overexposure dual columns;
   obtaining recovered pixel values of missing pixel points on the green channel by interpolation;
   calculating differences between pixel values of pixel points on the red and blue channels and the recovered pixel values on the green channel, respectively;
   performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

3. The method according to claim 1, wherein respectively acquiring on red, green, and blue channels recovered pixel values of pixel points of the missing dual columns in the underexposure image frame comprises:

calculating estimated pixel values of the pixel points of the missing dual columns by using pixel values of pixel points in adjacent underexposure dual columns;

obtaining recovered pixel values of missing pixel points on the green channel by interpolation;

calculating differences between pixel values of pixel points on the red and blue channels and the recovered pixel values on the green channel, respectively;

performing interpolation calculation on the differences between the pixel values of pixel points on the red and blue channels and the recovered pixel values on the green channel to obtain recovered values of differences between missing pixel points on the red/blue channel; and adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

4. The method according to claim 3, wherein the interpolation includes bilinear interpolation or cubic interpolation.

5. The method according to claim 1, wherein merging the overexposure image frame and the underexposure image frame to obtain a high dynamic range image frame comprises:

obtaining luminance of each pixel point in the underexposure image frame and the overexposure image frame, respectively, according to the pixel values of the pixel points on the red, green, and blue channels;

obtaining a weight value of each pixel point according to the luminance of each pixel point in the underexposure image frame and the overexposure image frame; and merging the overexposure image frame and the underexposure image frame according to the weight value of each pixel point to obtain a high dynamic range image frame.

6. The method according to claim 5, wherein obtaining a weight value of each pixel point according to the luminance of each pixel point in the underexposure image frame and the overexposure image frame comprises:

calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup (P_1 < T_1)} P_{2,x},$$

$$T_{2,new} = \min_{x \in \cup (P_2 > T_2)} P_{1,x}$$

wherein $P_1$ and $P_2$ are luminance of pixel points in the underexposure image frame and the overexposure image frame, respectively, $\cup(P_1 < T_2)$ represents a set of all underexposure pixels less than $T_1$ in $P_1$, and $\cup(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

wherein $\omega_1$ is a weight value of a pixel point in the underexposure image frame of which the luminance is $P_1$, and $\omega_2$ is a weight value of a pixel point in the overexposure image frame of which the luminance is $P_2$.

7. The method according to claim 6, wherein merging the overexposure image frame and the underexposure image frame according to the weight value of each pixel point to obtain a high dynamic range image frame further comprises:

performing convolutions on the weight value of each pixel point by using a two-dimensional Gaussian filter; and performing frame merging calculation and making contrast stretching by:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

wherein $$a_1 = 1 - \frac{|p_1 - 127|}{127}, \quad a_2 = 1 - \frac{|p_2 - 127|}{127},$$

for enhancing the contrast, and $q_{1,i}$ and $q_{2,i}$ are three color channels of an RGB diagram, respectively.

8. A Bayer color filter array based high dynamic range video recording device, comprising:

a sensor module for configuring different photosensitive times for exposure according to odd-numbered dual columns and even-numbered dual columns, and for obtaining an image frame with different exposure values of the odd-numbered and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;

a decomposition module connected with the sensor module for decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;

an underexposure pixel recovery module connected with the decomposition module for, with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;

an overexposure pixel recovery module connected with the decomposition module for, with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and a merging module connected with the underexposure pixel recovery module and the overexposure pixel recovery module for, according to the pixel values of the pixel points on the red, green, and blue channels in the underexposure image frame and the overexposure image frame, merging the overexposure image frame and the underexposure image frame to obtain a high dynamic range image frame.

9. The device according to claim 8, wherein the overexposure pixel recovery module is used for:
calculating estimated pixel values of the pixel points of the missing dual columns by using pixel values of pixel points in adjacent overexposure dual columns;
obtaining recovered pixel values of missing pixel points on the green channel by interpolation;
calculating differences between pixel values of pixel points on the red and blue channels and the recovered pixel values on the green channel, respectively;
performing interpolation calculation on the differences between the pixel values of pixel points on the red and blue channels and the recovered pixel values on the green channel to obtain recovered values of differences between missing pixel points on the red/blue channel; and
adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

10. The device according to claim 8, wherein the underexposure pixel recovery module is used for:
calculating estimated pixel values of the pixel points of the missing dual columns by using pixel values of pixel points in adjacent underexposure dual columns;
obtaining recovered pixel values of missing pixel points on the green channel by interpolation;
calculating differences between pixel values of pixel points on the red and blue channels and the recovered pixel values on the green channel, respectively;
performing interpolation calculation on the differences between the pixel values of pixel points on the red and blue channels and the recovered pixel values on the green channel to obtain recovered values of differences between missing pixel points on the red/blue channel; and
adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

11. The device according to claim 10, wherein the interpolation includes bilinear interpolation or cubic interpolation.

12. The device according to claim 8, wherein the merging module is used for:
obtaining luminance of each pixel point in the underexposure image frame and the overexposure image frame, respectively, according to the pixel values of the pixel points on the red, green, and blue channels;
obtaining a weight value of each pixel point according to the luminance of each pixel point in the underexposure image frame and the overexposure image frame; and
merging the overexposure image frame and the underexposure image frame according to the weight value of each pixel point to obtain a high dynamic range image frame.

13. The device according to claim 12, wherein the merging module is further used for:
calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup(P_1 < T_1)} P_{2,x},$$

$$T_{2,new} = \min_{x \in \cup(P_2 > T_2)} P_{1,x}$$

wherein $P_1$ and $P_2$ are luminance of pixel points in the underexposure image frame and the overexposure image frame, respectively, $\cup(P_1 < T_1)$ represents a set of all underexposure pixels less than $T_1$ in $P_1$, and $\cup(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \dfrac{T_{1,new} - P_1}{T_{1,new}} & P_1 < T_{1,new} \\ 0 & \text{others} \end{cases}$$

$$\omega_2 = \begin{cases} \dfrac{P_2 - T_{2,new}}{255 - T_{2,new}} & P_2 > T_{2,new} \\ 0 & \text{others} \end{cases}$$

wherein $\omega_1$ is a weight value of a pixel point in the underexposure image frame of which the luminance is $P_1$, and $\omega_2$ is a weight value of a pixel point in the overexposure image frame of which the luminance is $P_2$.

14. The device according to claim 13, wherein the merging module is further used for:
performing convolutions on the weight value of each pixel point by using a two-dimensional Gaussian filter; and
performing frame merging calculation and making contrast stretching by:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

wherein $$a_1 = 1 - \frac{|p_1 - 127|}{127}, a_2 = 1 - \frac{|p_2 - 127|}{127},$$

for enhancing the contrast, and $q_{1,i}$ and $q_{2,i}$ are three color channels of an RGB diagram, respectively.

15. A Bayer color filter array based high dynamic range video recording method, comprising:
    configuring different photosensitive times for exposure according to odd-numbered dual columns and even-numbered dual columns, wherein the odd-numbered dual columns are columns with column indices divisible by 4 or having a remainder of 1 when divided by 4, and the even-numbered dual columns are columns with column indices having a remainder of 2 or 3 when divided by 4;
    obtaining an image frame with different exposure values for the odd-numbered dual columns and the even-numbered dual columns;
    decomposing the image frame into an underexposure image frame and an overexposure image frame, wherein underexposure dual columns and missing dual columns are alternatingly distributed in the underexposure image frame, and overexposure dual columns and missing dual columns are alternatingly distributed in the overexposure image frame;
    with respect to the underexposure image frame, based on pixel values of pixel points in the underexposure dual columns, respectively acquiring on red, green, and blue channels recovered pixel values of pixel points of the missing dual columns in the underexposure image frame as the pixel values of the corresponding pixel points;
    with respect to the overexposure image frame, based on pixel values of pixel points in the overexposure dual columns, respectively acquiring on the red, green, and blue channels recovered pixel values of pixel points of the missing dual columns in the overexposure image frame as the pixel values of the corresponding pixel points; and
    according to the pixel values of the pixel points on the red, green, and blue channels in the underexposure image frame and the overexposure image frame, merging the overexposure image frame and the underexposure image frame to obtain a high dynamic range image frame by:
        obtaining luminance of each pixel point in the underexposure image frame and the overexposure image frame, respectively, according to the pixel values of the pixel points on the red, green, and blue channels;
        obtaining a weight value of each pixel point according to the luminance of each pixel point in the underexposure image frame and the overexposure image frame; and
        merging the overexposure image frame and the underexposure image frame according to the weight value of each pixel point to obtain a high dynamic range image frame.

16. The method according to claim 15, wherein respectively acquiring on the red, green, and blue channels recovered pixel values of pixel points of the missing dual columns in the overexposure image frame as the pixel values of the corresponding pixel points comprises:
    calculating estimated pixel values of the pixel points of the missing dual columns by using pixel values of pixel points in adjacent overexposure dual columns;
    obtaining recovered pixel values of missing pixel points on the green channel by interpolation;
    calculating differences between pixel values of pixel points on the red and blue channels and the recovered pixel values on the green channel, respectively;
    performing interpolation calculation on the differences between the pixel values of pixel points on the red and blue channels and the recovered pixel values on the green channel to obtain recovered values of differences between missing pixel points on the red/blue channel; and
    adding the recovered values of the differences between the missing pixel points on the red/blue channel to the recovered pixel values on the green channel, obtaining recovered pixel values on the red and blue channels to replace estimated values of the pixel points of the missing dual columns in the overexposure image frame, and using the recovered pixel values as the pixel values of the corresponding pixel points.

17. The method according to claim 15, wherein respectively acquiring on red, green, and blue channels recovered pixel values of pixel points of the missing dual columns in the underexposure image frame comprises:
    calculating estimated pixel values of the pixel points of the missing dual columns by using pixel values of pixel points in adjacent underexposure dual columns;
    obtaining recovered pixel values of missing pixel points on the green channel by interpolation;
    calculating differences between pixel values of pixel points on the red and blue channels and the recovered pixel values on the green channel, respectively;
    performing interpolation calculation on the differences between the pixel values of pixel points on the red and blue channels and the recovered pixel values on the green channel to obtain recovered values of differences between missing pixel points on the red/blue channel; and
    adding the recovered values of the differences between the missing pixel points on the red/blue channel to the recovered pixel values on the green channel, obtaining recovered pixel values on the red and blue channels to replace estimated values of the pixel points of the missing dual columns in the underexposure image frame, and using the recovered pixel values as the pixel values of the corresponding pixel points.

18. The method according to claim 17, wherein the interpolation includes bilinear interpolation or cubic interpolation.

19. The method according to claim 15, wherein obtaining a weight value of each pixel point according to the luminance of each pixel point in the underexposure image frame and the overexposure image frame comprises:
    calculating a self-adaptive underexposure threshold $T_{1,new}$ and a self-adaptive overexposure threshold $T_{2,new}$ based on a preset underexposure threshold $T_1$ and overexposure threshold $T_2$ by:

$$T_{1,new} = \max_{x \in \cup(P_1 < T_1)} P_{2,x},$$

$$T_{2,new} = \min_{x \in \cup(P_2 > T_2)} P_{1,x}$$

wherein $P_1$ and $P_2$ are luminance of pixel points in the underexposure image frame and the overexposure image frame, respectively, $\cup(P_1 < T_1)$ represents a set of all underexposure pixels less than $T_1$ in $P_1$, and $(P_2 > T_2)$ represents a set of all overexposure pixels greater than $T_2$ in $P_2$; and calculating the weight of each pixel point based on the self-adaptive underexposure threshold $T_{1,new}$ and the self-adaptive overexposure threshold $T_{2,new}$ by:

$$\omega_1 = \begin{cases} \dfrac{T_{1,new} - P_1}{T_{1,new}} & P_1 < T_{1,new} \\ 0 & others \end{cases}$$

$$\omega_2 = \begin{cases} \dfrac{P_2 - T_{2,new}}{255 - T_{2,new}} & P_2 > T_{2,new} \\ 0 & others \end{cases}$$

wherein $\omega_1$ is a weight value of a pixel point in the underexposure image frame of which the luminance is $P_1$, and $\omega_2$ is a weight value of a pixel point in the overexposure image frame of which the luminance is $P_2$.

20. The method according to claim 19, wherein merging the overexposure image frame and the underexposure image frame according to the weight value of each pixel point to obtain a high dynamic range image frame further comprises:

performing convolutions on the weight value of each pixel point by using a two-dimensional Gaussian filter; and performing frame merging calculation and making contrast stretching by:

$$q_{new,i} = (1-\omega_1)a_1 q_{1,i} + (1-\omega_2)a_2 q_{2,i} + \omega_1 q_{2,i} + \omega_2 q_{1,i} \quad i=1,2,3$$

wherein $$a_1 = 1 - \frac{|p_1 - 127|}{127}, a_2 = 1 - \frac{|p_2 - 127|}{127},$$

for enhancing the contrast, and $q_{1,i}$ and $q_{2,i}$ are three color channels of an RGB diagram, respectively.

* * * * *